United States Patent
Park et al.

(10) Patent No.: US 10,414,926 B2
(45) Date of Patent: *Sep. 17, 2019

(54) UV-CURABLE INK COMPOSITION, METHOD FOR PRODUCING BEZEL PATTERN OF DISPLAY SUBSTRATE USING SAME, AND BEZEL PATTERN PRODUCED THEREBY

(71) Applicant: LG CHEM, LTD., Seoul (KR)

(72) Inventors: Sung-Eun Park, Daejeon (KR);
Yong-Sung Goo, Daejeon (KR);
Seung-A Back, Daejeon (KR);
Joon-Hyung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 115 days.

This patent is subject to a terminal disclaimer.

(21) Appl. No.: 15/514,312

(22) PCT Filed: Sep. 30, 2015

(86) PCT No.: PCT/KR2015/010343
§ 371 (c)(1),
(2) Date: Mar. 24, 2017

(87) PCT Pub. No.: WO2016/048117
PCT Pub. Date: Mar. 31, 2016

(65) Prior Publication Data
US 2017/0298241 A1    Oct. 19, 2017

(30) Foreign Application Priority Data

Sep. 26, 2014 (KR) .................... 10-2014-0129417

(51) Int. Cl.
| | | |
|---|---|---|
| *C09D 11/101* | (2014.01) | |
| *B41M 7/00* | (2006.01) | |
| *C09D 11/03* | (2014.01) | |
| *C09D 11/102* | (2014.01) | |
| *C09D 11/36* | (2014.01) | |
| *C09D 11/38* | (2014.01) | |
| *B41F 17/00* | (2006.01) | |
| *C09D 11/037* | (2014.01) | |
| *C09D 11/324* | (2014.01) | |
| *G09F 9/00* | (2006.01) | |
| *C08F 2/48* | (2006.01) | |
| *B41J 11/00* | (2006.01) | |
| *H05K 1/09* | (2006.01) | |
| *H05K 3/12* | (2006.01) | |
| *C09D 11/00* | (2014.01) | |
| *C09D 171/00* | (2006.01) | |

(52) U.S. Cl.
CPC .......... *C09D 11/101* (2013.01); *B41F 17/006* (2013.01); *B41J 11/002* (2013.01); *B41M 7/00* (2013.01); *B41M 7/009* (2013.01); *C08F 2/48* (2013.01); *C09D 11/00* (2013.01); *C09D 11/03* (2013.01); *C09D 11/037* (2013.01); *C09D 11/102* (2013.01); *C09D 11/324* (2013.01); *C09D 11/36* (2013.01); *C09D 11/38* (2013.01); *C09D 171/00* (2013.01); *G09F 9/00* (2013.01); *H05K 1/092* (2013.01); *H05K 3/12* (2013.01); *H05K 3/125* (2013.01); *H05K 3/1275* (2013.01); *H05K 2203/0534* (2013.01)

(58) Field of Classification Search
CPC ... C09D 11/101; C09D 11/324; C09D 11/102; C09D 11/38; B41J 11/002; B41M 7/009; H05K 1/092; H05K 3/125; H05K 3/12; H05K 3/1275
See application file for complete search history.

(56) References Cited

U.S. PATENT DOCUMENTS

| | | | |
|---|---|---|---|
| 2002/0099110 A1* | 7/2002 | Norlin ................ | C03C 25/1055 522/35 |
| 2005/0113483 A1* | 5/2005 | Takabayashi ........ | C09D 11/101 523/160 |
| 2010/0026743 A1* | 2/2010 | Van Thillo ............... | B41J 2/175 347/9 |
| 2010/0079568 A1 | 4/2010 | Miura et al. | |
| 2014/0186592 A1 | 7/2014 | Jeon et al. | |
| 2014/0342129 A1 | 11/2014 | Kim et al. | |
| 2015/0125789 A1 | 5/2015 | Park et al. | |

FOREIGN PATENT DOCUMENTS

| | | | | |
|---|---|---|---|---|
| JP | 2010-7000 A | | 1/2010 | |
| JP | 2010-13596 A | | 1/2010 | |
| JP | 2010013596 A | * | 1/2010 | ............ C09D 11/00 |
| JP | 2010-106254 A | | 5/2010 | |
| JP | 2013-147568 A | | 8/2013 | |
| JP | 2014-148580 A | | 8/2014 | |
| KR | 10-2013-0132322 A | | 12/2013 | |
| KR | 10-2014-0086584 A | | 7/2014 | |
| WO | 2014/010884 A1 | | 1/2014 | |

OTHER PUBLICATIONS

Material Safety Data Sheet, Aron Oxtane OXT-221 (Year: 2002).*
Material Safety Data Sheet, Aron Oxtane OXT-212 (Year: 2002).*

* cited by examiner

*Primary Examiner* — Betelhem Shewareged
(74) *Attorney, Agent, or Firm* — Dentons US LLP

(57) ABSTRACT

The present invention relates to a UV-curable ink composition, a method for producing a bezel pattern of a display substrate using same, and a bezel pattern produced thereby, the UV-curable ink composition comprising a colorant, an epoxy compound, an oxetane compound, a photopolymerization initiator, and an adhesion promoter, wherein the content ratio of the epoxy compound to the oxetane compound is 1:0.5-1:6, and an adhesion to a glass substrate after curing is 4B or higher according to the ASTM D3359 standard.

35 Claims, No Drawings

UV-CURABLE INK COMPOSITION, METHOD FOR PRODUCING BEZEL PATTERN OF DISPLAY SUBSTRATE USING SAME, AND BEZEL PATTERN PRODUCED THEREBY

TECHNICAL FIELD

This application is a National Stage Application of International Application No. PCT/KR2015/010343 filed on Sep. 30, 2015, which claims the benefit of Korean Patent Application No. 10-2014-0129417 filed on Sep. 26, 2014 and Korean Patent Application No. 10-2015-0138096 filed on Sep. 30, 2015, all of which are hereby incorporated by reference in their entirety for all purposes as if fully set forth herein.

The present invention relates to a UV-curable ink composition, a method for producing a bezel pattern of a display substrate using the same, and a bezel pattern produced thereby.

BACKGROUND ART

In a display device, a method for forming a bezel pattern on a substrate has been used instead of using a separate bezel structure in order to achieve the weight reduction and thinning.

In the method for producing a display substrate in the related art, a photosensitive resin composition by free radical polymerization is used in most cases. However, since the free radical polymerization resin composition has a large curing shrinkage, the bezel film may be easily detached from the substrate. Korean Patent Laid-Open Publication No. 2015-106665A discloses a colored photosensitive resin composition having excellent adhesion to a substrate and comprising an adhesion promoter in order to solve such a problem. However, post-baking process such as heating at a temperature of 200° C. or more for 20 minutes is required.

Therefore, there is a need for developing a method for forming a bezel pattern which can easily improve the adhesion to the substrate compared to the method for forming a bezel pattern in the related art.

DISCLOSURE

Technical Problem

Therefore, the present invention has been made keeping in mind the above problems encountered in the related art, and an object of the present invention is to provide a method for producing a bezel pattern, which uses an UV-curable ink composition having low shrinkage and high adhesion to a glass base material when the composition is cured, a bezel pattern produced thereby, and a display substrate including the same.

Technical Solution

In order to solve the problem, the present invention provides a UV-curable ink composition comprising a colorant, an epoxy compound, an oxetane compound, a photopolymerization initiator, and an adhesion promoter, wherein a content ratio of the epoxy compound to the oxetane compound is 1:0.5 to 1:6, and adhesion force to a glass base material after curing is 4B or higher according to the ASTM D3359 standard.

Further, the present invention provides a method for producing a bezel pattern for a display substrate, comprising: forming a bezel pattern on a substrate by using the UV-curable ink composition; and curing the bezel pattern.

In addition, the present invention provides a bezel pattern for a display substrate, which is formed on a substrate by curing the UV-curable ink composition.

Advantageous Effects

A photosensitive resin composition according to one embodiment of the present invention can produce a bezel pattern having a higher adhesion to a glass base material than a conventional bezel pattern.

BEST MODE

Hereinafter, the present invention will be described in more detail.

The present invention provides a UV-curable ink composition comprising a colorant, an epoxy compound, an oxetane compound, a photopolymerization initiator, and an adhesion promoter, wherein a content ratio of the epoxy compound to the oxetane compound is 1:0.5 to 1:6, and adhesion force to a glass base material after curing is 4B or higher according to the ASTM D3359 standard.

Further, the UV-curable ink composition of the present invention may further comprise one or more selected from the group consisting of a surfactant, a diluent and a photosensitizer.

In the UV-curable ink composition, a radical polymerizable resin and a cationic polymerizable resin may be usually used. The radical polymerizable resin is not suitable for curing of a thin film because of curing failure due to oxygen, and is not suitable for forming a bezel pattern because curing shrinkage is so large that adhesion to a glass base material is low. In contrast, the cationic polymerizable resin is advantageous in curing a thin film because the resin typically has low curing shrinkage and is slightly affected by oxygen.

The UV-curable ink composition used in the present invention comprises an epoxy compound as a cationic curing component. The epoxy compound may be specifically one or a mixture of two selected from a bisphenol type epoxy compound, a novolac type epoxy compound, a glycidyl ester type epoxy compound, a glycidyl amine type epoxy compound, a linear aliphatic epoxy compound, a biphenyl type epoxy compound, and an alicyclic epoxy compound.

The alicyclic epoxy compound may mean a compound including one or more epoxidized aliphatic ring groups.

In the alicyclic epoxy compound including an epoxidized aliphatic ring group, the epoxidized aliphatic ring group means an epoxy group bonded to an alicyclic ring. It can exemplify a functional group, such as a 3,4-epoxycyclopentyl group, a 3,4-epoxycyclohexyl group, a 3,4-epoxycyclopentylmethyl group, a 3,4-epoxycyclohexylmethyl group, a 2-(3,4-epoxycyclopentyl)ethyl group, a 2-(3,4-epoxycyclohexyl)ethyl group, a 3-(3,4-epoxycyclopentyl)propyl group or a 3-(3,4-epoxycyclohexyl)propyl group. A hydrogen atom constituting the alicyclic ring may also be optionally substituted with a substituent such as an alkyl group. As the alicyclic epoxy compound, for example, a compound to be specifically exemplified below may be used, but is not limited thereto.

For example, it is possible to use dicyclopentadiene dioxide, cyclohexene oxide, 4-vinyl-1,2-epoxy-4-vinyl cyclohexene, vinyl cyclohexene dioxide, limonene monoxide, limonene dioxide, (3,4-epoxycyclohexyl)methyl-3,4-epoxycyclohexane carboxylate, 3-vinylcyclohexene oxide, bis(2,3-epoxycyclopentyl)ether, bis(3,4-epoxycyclohexyl methyl)adipate, bis(3,4-epoxy-6-methylcyclohexyl methyl) adipate, (3,4-epoxycyclohexyl)methyl alcohol, (3,4-epoxy-6-methylcyclohexyl)methyl-3,4-epoxy-6-methylcyclohexane carboxylate, ethylene glycol bis(3,4-epoxycyclohexyl)ether, 3,4-epoxycyclohexene carboxylic acid ethylene glycol diester, (3,4-epoxycyclohexyl)ethyl trimethoxysilane, Celloxide 8000 manufactured by Daicel Corp., and the like.

The content of the epoxy compound may be preferably 5 to 60 wt %, and more preferably 10 to 30 wt %, with respect to a total weight of the UV-curable ink composition. When the content exceeds 60 wt %, the viscosity of the composition increases, and when the content is less than 5 wt %, the curing sensitivity deteriorates.

The UV-curable ink composition comprises an oxetane compound as another cationic polymerizable monomer.

The oxetane compound is a compound having a 4-membered cyclic ether group in a molecular structure thereof, and may serve to lower the viscosity of the cationically cured ink composition, for example to less than 50 cPs at 25° C.

Specifically, it is possible to use 3-ethyl-3-hydroxymethyl oxetane, 1,4-bis[(3-ethyl-3-oxetanyl)methoxymethyl]benzene, 3-ethyl-3-(phenoxymethyl)oxetane, di[(3-ethyl-3-oxetanyl)methyl]ether, 3-ethyl-3-(2-ethylhexyloxymethyl)oxetane, 3-ethyl-3-cyclohexyloxymethyl oxetane or phenol novolac oxetane, and the like. As the oxetane compound, it is possible to use, for example, 'ARON OXETANE OXT-101', 'ARON OXETANE OXT-121', 'ARON OXETANE OXT-211', 'ARON OXETANE OXT-221' or 'ARON OXETANE OXT-212', manufactured by Toagosei Co., Ltd., and the like. The oxetane compounds may be used either alone or in combination of two or more thereof.

The content of the oxetane compound may be preferably 15 to 80 wt %, and more preferably 40 to 60 wt %, with respect to the total weight of the UV-curable ink composition. When the content exceeds 80 wt %, the curing sensitivity is low, and when the content is less than 15 wt %, the viscosity is increased, and as a result, the coatability deteriorates.

Further, the oxetane compound of the present invention may be used comprising an oxetane compound having one oxetane ring and an oxetane compound having two oxetane rings. When the oxetane compound having one oxetane ring and the oxetane compound having two oxetane rings are together used, there is an advantage in that the viscosity and the flexibility of the film may be adjusted. When two oxetane compounds are together used as described above, it is preferred to use the two oxetane compounds in a content range of the oxetane compound having one oxetane ring to the oxetane compound having two oxetane rings of 1:16 to 1:3.

Further, the present invention has a content ratio of the epoxy compound to the oxetane compound of 1:0.5 to 1:6. When the ratio of the epoxy compound and the oxetane compound exceeds 1:6, the coatability of the composition is excellent as the viscosity of the composition is low, but the curing sensitivity may deteriorate. When the ratio is less than 1:0.5, the coatability may deteriorate as the viscosity of the composition is high.

The ink composition of the present invention comprises a compound which produces a cationic species or a Bronsted acid by irradiation of UV rays as a cationic photopolymerization initiator, for example, an iodonium salt or a sulfonium salt, but not limited thereto.

The iodonium salt or sulfonium salt causes a curing reaction in which monomers having an unsaturated double bond contained in ink are reacted to form a polymer during the UV curing process. A photosensitizer may also be used according to the polymerization efficiency.

As an example, the photopolymerization initiator may be a photopolymerization initiator having an anion represented by $SbF_6^-$, $AsF_6^-$, $BF_6^-$, $(C_6F_5)_4B^-$, $PF_6^-$ or $RfnF_{6-n}$, but is not limited thereto.

The photopolymerization initiator may be contained in an amount of preferably 1 to 15 wt %, and more preferably 2 to 10 wt %, with respect to the total weight of the UV-curable ink composition. When the content of the photopolymerization initiator is less than 1 wt %, the curing reaction is not sufficient, and when the content exceeds 15 wt %, the photopolymerization initiator is not all dissolved, or the viscosity is increased, and as a result, the coatability may deteriorate.

The UV-curable ink composition may further comprise an adhesion promoter as an additive.

The film attached on the bezel pattern repeatedly shrinks and expands depending on the use conditions such as temperature and humidity, so that stress is imposed on the bezel pattern, and as a result, the film and the bezel may detach from the glass base material. When one or more silane-based compounds selected from the group consisting of amino silane-based compounds, alkoxy silane-based compounds, epoxy silane-based compounds, aminophenyl silane-based compounds, amino silane-based compounds, mercapto silane-based compounds, and vinyl silane-based compounds are used as an adhesion promoter in order to prevent the detachment, an excellent result may be exhibited.

Among them, epoxy silane-based compounds are more preferred as the adhesion promoter of the present invention.

In an exemplary embodiment of the present invention, excellent adhesion force was exhibited between a bezel pattern and a glass base material by using an epoxy silane-based compound as the adhesion promoter. Specifically, the adhesive force to a glass base material after the UV-curable ink composition of the present invention may be 4B or higher according to the ASTM D3359 standard.

The adhesion promoter is contained in an amount of preferably 0.1 to 15 wt %, and more preferably 2 to 10 wt %, with respect to the total weight of the ink composition. There are problems in that when the content is less than 0.1 wt %, the bezel pattern cannot be prevented from being peeled off from the glass base material, and when the content exceeds 15 wt %, the viscosity of the ink solution is increased, and the dispersibility is low.

The ink composition may further comprise a diluent for improving the coating property by lowering the viscosity of the ink to increase the flowability.

Examples of the diluent comprise one or more selected from the group consisting of methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxy propanol, 2-methoxy propanol, 2-ethoxy ethanol, 3-methoxy butanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate, but is not limited thereto.

The content of the diluent is preferably 0 to 30 wt %, more preferably 0.1 to 20 wt % based on the total weight of the UV curable ink composition. If it is more than 30 wt %, the curing sensitivity is lowered.

The UV-curable ink composition comprises a colorant.

As the colorant, one or more pigments, dyes, or mixtures thereof may be used, and the colorant is not particularly limited as long as the colorant may express a color if necessary.

As an exemplary embodiment of the present invention, it is possible to use carbon black, graphite, metal oxides, an organic black pigment, and the like as a black pigment.

Examples of carbon black may include SEAST 5HIISAF-HS, SEAST KH, SEAST 3HHAF-HS, SEAST NH, SEAST 3M, SEAST 300HAF-LS, SEAST 116HMMAF-HS, SEAST 116MAF, SEAST FMFEF-HS, SEAST SOFEF, SEAST VGPF, SEAST SVHSRF-HS and SEAST SSRF (Tokai Carbon Co., Ltd.); DIAGRAM BLACK II, DIAGRAM BLACK N339, DIAGRAM BLACK SH, DIAGRAM BLACK H, DIAGRAM LH, DIAGRAM HA, DIAGRAM SF, DIAGRAM N550M, DIAGRAM M, DIAGRAM E, DIAGRAM G, DIAGRAM R, DIAGRAM N760M, DIAGRAM LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B (Mitsubishi Chemical Corp.); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 (Colombia Carbon Co., Ltd.) or mixtures thereof, and the like.

As the organic black pigment, aniline black, lactam black or perylene black series, and the like may be used, but the organic black pigment is not limited thereto.

In the present invention, the UV-curable ink composition is cured by irradiation of UV ray (i.e., 250 or 450 nm), more preferably UV rays with a long wavelength (for example, 360 to 410 nm), and thus has a certain level of optical density (OD). For this purpose, the content of the colorant may be preferably 1 to 15 wt %, and more preferably 3 to 10 wt %, with respect to the total weight of the UV-curable ink composition. When the content of the colorant is less than 1 wt %, a level of OD which is applicable to the bezel may not be exhibited, and when the content exceeds 15 wt %, an excessive amount of the colorant may not be dispersed in ink, and a precipitate may be formed.

When the content of the colorant is within the range, the OD value may be maintained in a range of 0.05 to 2.5 per a film thickness of 1.0 μm.

The UV-curable ink composition comprises a surfactant that lowers the surface tension of the ink composition to exhibit a small taper angle.

As the surfactant, a commercially available product can be used, for example F-444, F-475, F-478, F-479, F-484, F-550, F-552, F-553, F-555, F-570, and RS-75, which are manufactured by DaiNippon Ink & Chemicals, or Surflon 5-111, 5-112, S-113, S-121, 5-131, 5-132, 5-141 and S-145, which are manufactured by Asahi Glass Company, or Fluorad FC-93, FC-95, FC-98, FC-129, FC-135, FC-170C, FC-430 and FC-4430, which are manufactured by Sumitomo 3M Co., Ltd, or Zonyl FS-300, FSN, FSN-100 and FSO, which are manufactured by Dupont Co., and BYK-306, BYK-310, BYK-320, BYK-330, BYK-331, BYK-333, BYK-342, BYK-350, BYK-354, BYK-355, BYK-356, BYK-358N, BYK-359, BYK-361N, BYK-381, BYK-370, BYK-371, BYK-378, BYK-388, BYK-392, BYK-394, BYK-399, BYK-3440, BYK-3441, BYKETOL-AQ, BYK-DYNWET 800, BYK-SILCLEAN 3700 and BYK-UV 3570, which are manufactured by BYK Chemie, or Rad 2100, Rad 2011, Glide 100, Glide 410, Glide 450, Flow 370 and Flow 425, which are manufactured by of Tego Corporation, and the like.

The surfactant is contained in an amount of preferably 0.1 to 5.0 wt %, and more preferably 0.5 to 3.0 wt % with respect to the total weight of the UV-curable ink composition. In case that the content of the surfactant is less than 0.1 wt %, an effect of lowering the surface tension of the composition is not sufficient, and as a result, coating defects occur when the composition is coated. In case that the content exceeds 5.0 wt %, the surfactant is used in an excessive amount, and as a result, the compatibility with the composition and the anti-foaming property are rather reduced.

The UV-curable ink composition may further comprise a photosensitizer in order to complement the curability by the active energy ray having a long wavelength.

The photosensitizer may be one or more selected from the group consisting of anthracene-based compounds, such as anthracene, 9,10-dibutoxy anthracene, 9,10-dimethoxy anthracene, 9,10-diethoxy anthracene, and 2-ethyl-9,10-dimethoxy anthracene; benzophenone-based compounds, such as benzophenone, 4,4-bis(dimethylamino)benzophenone, 4,4-bis(diethylamino)benzophenone, 2,4,6-trimethylaminobenzophenone, methyl-o-benzoylbenzoate, 3,3-dimethyl-4-methoxybenzophenone, and 3,3,4,4-tetra(t-butylperoxycarbonyl)benzophenone; acetophenone; ketone-based compounds, such as dimethoxy acetophenone, diethoxy acetophenone, 2-hydroxy-2-methyl-1-phenylpropan-1-one, and propanone; perylene; fluorenone-based compounds, such as 9-fluorenone, 2-chloro-9-fluorenone, and 2-methyl-9-fluorenone; thioxanthone-based compounds, such as thioxanthone, 2,4-diethylthioxanthone, 2-chlorothioxanthone, 1-chloro-4-propyloxythioxanthone, isopropylthioxanthone (ITX) and diisopropylthioxanthone; xanthone-based compounds, such as xanthone and 2-methylxanthone; anthraquinone-based compounds, such as anthraquinone, 2-methyl anthraquinone, 2-ethyl anthraquinone, t-butyl anthraquinone and 2,6-dichloro-9,10-anthraquinone; acridine-based compounds, such as 9-phenylacridine, 1,7-bis(9-acridinyl)heptane, 1,5-bis(9-acridinyl)pentane and 1,3-bis(9-acridinyl)propane; dicarbonyl compounds, such as benzyl, 1,7,7-trimethyl-bicyclo[2,2,1]heptane-2,3-dione and 9,10-phenanthrenequinone; phosphine oxide-based compounds, such as 2,4,6-trimethylbenzoyl diphenylphosphine oxide and bis(2,6-dimethoxybenzoyl)-2,4,4-trimethylpentyl phosphine oxide; benzoate-based compounds, such as methyl-4-

(dimethylamino)benzoate, ethyl-4-(dimethylamino)benzoate, and 2-n-butoxyethyl-4-(dimethylamino)benzoate; amino synergists, such as 2,5-bis(4-diethylaminobenzal)cyclopentanone, 2,6-bis(4-diethylaminobenzal)cyclohexanone and 2,6-bis(4-diethylaminobenzal)-4-methyl-cyclohexanone; coumarin-based compounds, such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H, 11H—Cl]-benzopyrano[6,7,8-ij]-quinolizin-11-one; chalcone compounds, such as 4-diethylaminochalcone and 4-azidobenzalacetphenone; 2-benzoylmethylene; and 3-methyl-b-naphthothiazoline.

The photosensitizer is contained in an amount of preferably 1 to 200 parts by weight, and more preferably 10 to 100 parts by weight, with respect to 100 parts by weight of the photopolymerization initiator. There are problems in that when the content is less than 1 part by weight, the synergistic action of curing sensitivity may not be expected at a desired wavelength, and when the content exceeds 200 parts by weight, the photosensitizer is not dissolved and the adhesive force of the pattern and the crosslinking density deteriorate.

The UV-curable ink composition used in the present invention spreads within a short period of time immediately after inkjet printing, and thus exhibits excellent coating film characteristics, and the composition is cured to exhibit excellent adhesive characteristics. Therefore, when the UV-curable ink composition is applied, it is preferred to dispose a UV-lamp right behind the inkjet head such that the ink composition may be cured simultaneously with the inkjet printing.

The dose for curing the UV-curable ink composition is 1 to 10,000 mJ/cm$^2$, preferably 80 to 2,000 mJ/cm$^2$.

The UV-curable ink composition is cured by absorbing radiation in a wavelength range of 250 nm to 450 nm, preferably 360 nm to 410 nm.

The UV-curable ink composition has a viscosity of 1 cP to 50 cP at 25° C., more preferably 3 cP to 45 cP at 25° C. as an example, and thus is suitable for the inkjet process. The ultraviolet curable ink composition having the viscosity range as described above has good ejection at the process temperature. The process temperature means a temperature heated such that a viscosity of the curable ink composition is reduced. The process temperature may be 10° C. to 100° C., preferably 20° C. to 70° C.

The adhesion force with respect to the glass base material of the bezel pattern formed according to the method of the present invention by using the adhesion promoter is 4B or higher according to the ASTM D3359 standard, and the adhesion force and coatability of the bezel pattern are excellent.

The method for producing a bezel pattern of a display substrate according to the present invention uses the UV-curable ink composition.

Specifically, the method for producing a bezel pattern of a display substrate according to the present invention comprises: a) forming a bezel pattern on a substrate by using the UV-curable ink composition; and b) curing the bezel pattern.

In addition, the method for producing a bezel pattern of a display substrate according to the present invention may further comprise cleaning and drying the substrate prior to a) the forming of the bezel pattern. The cleaning and drying is for selectively carrying out a surface treatment depending on the surface energy of the substrate in order to improve coating properties of the ink and remove stains caused by foreign substances.

Specifically, the surface treatment may be carried out by a treatment such as a wet surface treatment, a UV ozone treatment, and a normal pressure plasma treatment.

As the method for forming a bezel pattern on the substrate, it is possible to use a method selected from an inkjet printing using a UV-curable resin instead of photolithography and screen printing, a gravure coating, and a reverse offset coating. In order to applying the method, the ink composition of the present invention may have a viscosity of 1 cP to 50 cP, and preferably 3 cP to 45 cP.

In order to form a bezel pattern on a specific portion of the substrate by the aforementioned method, the ink composition having a low viscosity of 1 cP to 50 cP is applied at a height of 0.1 to 20 µm, and more specifically 0.5 to 5 µm. The applied composition is cured by exposure including UV rays, and as a result, a bezel pattern having a thin film thickness of 0.1 to 20 µm, and more specifically 0.5 to 5 µm may be manufactured.

In the present invention, examples of a light source for curing the UV-curable composition include a mercury vapor arc, a carbon arc, a Xe arc, an LED curing device, and the like, which emit a light with a wavelength of 250 nm to 450 nm, but are not limited thereto.

The bezel pattern has a taper angle of more than 0° and 30° or less and a thickness of 0.1 µm to 20 µm, which are measured after a curing treatment. Further, the taper angle may be preferably more than 0° and 10° or less. In addition, the thickness may be preferably 0.5 µm to 5 µm. The bezel pattern of the present invention has the aforementioned features, and thus may not exhibit a short-circuit due to a large step difference and deterioration in appearance quality due to generation of bubbles and release of the film.

The optical density of the bezel pattern may be 0.05 to 2.5 per a film thickness of 1.0 µm, and if necessary 0.25 to 1.0. In this case, there is an advantage in that shielding characteristics due to the bezel pattern are excellent. When the optical density exceeds 2.5, the manufacture of ink and the inkjet process may be adversely affected because a required content of pigment to be introduced is very high, and it is possible to inhibit the UV-curable ink composition from being cured by radiation.

In the bezel pattern, the adhesion force to the glass base material is 4B or higher according to the ASTM D3359 standard and the adhesion force and the coatability are excellent.

The present invention provides a bezel pattern of a display substrate, which is manufactured by the method. The bezel pattern in the present invention refers to a pattern formed at the edge portion of various devices such as a clock and a display device.

The bezel pattern has a taper angle of more than 0° and 30° or less and a thickness of 0.1 µm to 20 µm, which are measured after a curing treatment. Further, the taper angle may be preferably more than 0° and 10° or less. In addition, the thickness may be preferably 0.5 µm to 5 µm. The bezel pattern of the present invention has the aforementioned features, and thus may not exhibit a short-circuit due to a large step difference and deterioration in appearance quality due to generation of bubbles and release of the film.

The optical density of the bezel pattern may be 0.05 to 2.5, and if necessary 0.25 to 1.0 per a film thickness of 1.0 µm. In this case, there is an advantage in that shielding characteristics due to the bezel pattern are excellent. When the optical density exceeds 2.5, the manufacture of ink and the inkjet process may be adversely affected because a required content of pigment to be introduced is very high, and it is possible to inhibit the UV-curable ink composition from being cured by radiation.

In the bezel pattern, the adhesion force to the glass base material after curing treatment is 4B or higher according to the ASTM D3359 standard, and the adhesion force and the coatability are excellent.

Furthermore, the present invention provides a display substrate including the bezel pattern.

The display substrate may be used in any one of a plasma display panel (PDP), a light emitting diode (LED), an organic light emitting diode (OLED), a liquid crystal display (LCD) device, a thin film transistor-liquid crystal display (LCD-TFT) device, and a cathode ray tube (CRT).

MODE FOR INVENTION

Hereinafter, the present invention will be described in detail with reference to the Examples. The following Examples are provided for describing the present invention, and the scope of the present invention includes the scope described in the following claims and the substitution and modification thereof, and is not limited to the scope of the Examples.

EXAMPLES

The compositions for forming a bezel pattern in Examples 1 to 9 and Comparative Examples 1 to 3 were prepared by mixing the compositions as in the following Table 1 and stirring the compositions for 3 hours.

<Preparation Example 1> Manufacture of Bezel Pattern

The compositions prepared in Examples 1 to 9 and Comparative Examples 1 to 3 were coated on a cleaned LCD glass base material by the inkjet coating method so as to have a thickness of 2 μm after curing. Bezel patterns were formed by irradiating ultraviolet rays on the coating layer under the following conditions within 1 minute after coating in order to prevent foreign substances from being attached and by curing the compositions. The UV ray irradiator was a high pressure mercury lamp and irradiated with a light quantity of 1000 mJ/$cm^2$ based on UVV.

<Preparation Example 2> Manufacture of Display Device Using Bezel Pattern

A bezel pattern was formed on the upper surface of the display panel (hereinafter, referred to as the panel) by the method in Preparation Example 1, and as an upper base material, an NRT polarization film manufactured by LG Chem., which used an acrylic adhesive layer, was attached thereto. After the attachment, the surroundings thereof were capped by a sealant in order to prevent moisture and foreign substance from being incorporated into the gap between the polarization film and the pattern.

TABLE 1

| | Colorant A | Epoxy B | Oxetane C | Polymerization initiator D | Surfactant E | Adhesion promoter F |
|---|---|---|---|---|---|---|
| Example | | | | | | |
| 1 | A1: 5 | B1: 20 | C2: 68 | D1: 4 | E1: 1 | F1: 2 |
| 2 | A1: 5 | B2: 30 | C2: 58 | D1: 4 | E1: 1 | F2: 2 |
| 3 | A1: 5 | B2: 30 | C2: 58 | D2: 4 | E1: 1 | F3: 2 |
| 4 | A1: 5 | B1: 30 | C1: 15 C2: 43 | D3: 4 | E1: 1 | F4: 2 |
| 5 | A1: 5 | B1: 30 | C1: 15 C2: 43 | D4: 4 | E1: 1 | F5: 2 |
| 6 | A1: 5 | B1: 30 | C3: 15 C2: 43 | D5: 4 | E1: 1 | F6: 2 |
| 7 | A1: 5 | B1: 20 | C2: 62 | D4: 4 | E1: 1 | F1: 8 |
| 8 | A1: 5 | B2: 30 | C2: 52 | D4: 4 | E1: 1 | F2: 8 |
| 9 | A1: 5 | B2: 30 | C1: 15 C2: 37 | D4: 4 | E1: 1 | F3: 8 |
| Comparative Example | | | | | | |
| 1 | A1: 5 | B1: 30 | C2: 59 | D1: 5 | E1: 1 | — |
| 2 | A1: 5 | B2: 30 | C2: 59 | D1: 5 | E1: 1 | — |
| 3 | A1: 5 | B2: 30 | C2: 39 | D2: 5 | E1: 1 | F1: 20 |

A1: Carbon black
B1: Celloxide 2021P (Daicel Corp.)
B2: Celloxide 3000 (Daicel Corp.)
C1: ARON OXETANE 101 (Toagosei Co., Ltd.)
C2: ARON OXETANE 221 (Toagosei Co., Ltd.)
C3: ARON OXETANE 212 (Toagosei Co., Ltd.)
C4: ARON OXETANE 121 (Toagosei Co., Ltd.)
D1: CPI-200K (SAN-APRO LIMITED)
D2: Irgacure 270 (BASF)
D3: Irgacure 290 (BASF)
D4: UV-694 (Tetrachem)
D5: Rhodorsil 2074 (Bluestar Silicones)
E1: BYK-330 (BYK Chemie)
F1: KBM-303 (Shin-Etsu)
F2: KBE-402 (Shin-Etsu)
F3: KBM-403 (Shin-Etsu)
F4: KBE-403 (Shin-Etsu)
F5: KBM-503 (Shin-Etsu)
F6: KBE-503 (Shin-Etsu)

<Experimental Example 1>: Viscosity

For the compositions prepared in Examples 1 to 9 and Comparative Examples 1 to 3, viscosities were measured. As a viscosity measurement apparatus, DV-III+ manufactured by Brookfield Industries, Inc. was used.

<Experimental Example 2>: Measurement of Curing Sensitivity

In order to measure the curing sensitivity of the bezel pattern prepared according to Preparation Example 1, at 5 minutes after UV irradiation, the state of the surface was confirmed by the examiner pressed the surface with the latex glove put on.

∘: The bezel pattern was not sticky, and completely cured

Δ: The bezel pattern was cured, but was sticky x: The bezel pattern was insufficiently cured, and as result, unreacted residues were spotted

<Experimental Example 3>: Evaluation of OD of Bezel Pattern

In the method of Production Example 1, the OD of the bezel film prepared by coating on a general LCD glass base material by spin coating instead of inkjet coating and exposing was measured using an OD measuring instrument manufactured by X-rite. The OD was converted to the value based on a thickness of 1 μm. The coated base material was put over the LCD monitor panel to confirm hiding power to shield internal wiring and metal.

<Experimental Example 4>: Cross-Hatch Adhesion Force

According to the ASTM D3359 standard which is a cross-cut test standard of the bezel pattern manufactured in Preparation Example 1, a cross-cut test was performed. Before the cross-cut test was performed, a heat treatment may be performed at a temperature of 60° C. for 1 minute in order to facilitate the reaction of the adhesion promoter according to the samples. Specifically, on a test sample, 11 lines were each scratched at an interval of 1 mm in the cross and machine directions to form 100 square lattices having a length and breadth of 1 mm each. And then, a CT-24 adhesive tap manufactured by Nichiban Co., Ltd. was attached to the cut surface, and then at the time of detaching the tape, the state of the surface which was falling apart together was measured to evaluate the state according to the following criteria.

<Evaluation Standard of Cross-Hatch Adhesive Force>

5B: Case where no surface fell apart

4B: Case where the area of the fallen surface was within 5% compared to the total surface 3B: Case where the area of the fallen surface was 5 to 15% compared to the total surface 2B: Case where the area of the fallen surface was 15 to 35% compared to the total surface 1B: Case where the area of the fallen surface was 35 to 65% compared to the total surface 0B: Case where almost all the surface was fallen apart

TABLE 2

| | | Conditions | |
|---|---|---|---|
| Example | Viscosity (cP) | Whether cured or not 5 minutes after UV irradiation, ∘: tack-free Δ: tacky X: unreacted | Attaching force for the lower substrate ASTM-D3359 |
| 1 | 25 | ∘ | 4B |
| 2 | 15 | ∘ | 5B |
| 3 | 15 | ∘ | 5B |
| 4 | 30 | ∘ | 5B |
| 5 | 31 | ∘ | 4B |
| 6 | 30 | ∘ | 4B |
| 7 | 22 | ∘ | 5B |
| 8 | 14 | ∘ | 5B |
| 9 | 15 | ∘ | 5B |
| Comparative Example | | | |
| 1 | 120 | ∘ | 0B |
| 2 | 45 | ∘ | 0B |
| 3 | 35 | X | Not measurable due to poor curing |

Referring to Table 2, it can be seen that the bezel patterns produced using the ink compositions of Examples 1 to 9 exhibit curing sensitivity similar to those of the comparative examples, and overall adhesion to the glass base material is superior to the comparative examples.

The invention claimed is:

1. A UV-curable ink composition for forming a bezel pattern comprising a colorant, an epoxy compound, an oxetane compound, a photopolymerization initiator, a surfactant and an adhesion promoter,
wherein a content ratio of the epoxy compound to the oxetane compound is 1:1.7 to 1:6, the adhesion promoter is one or more epoxy silane-based compounds, the adhesion promoter is contained in an amount of 2 to 8 wt % with respect to the total weight of the UV-curable ink composition, and adhesive force to a glass base material after curing is 4B or higher according to the ASTM D3359 standard.

2. The UV-curable ink composition of claim 1, further comprising one or more selected from the group consisting of a diluent, and a photosensitizer.

3. The UV-curable ink composition of claim 1, wherein the oxetane compound comprises an oxetane compound having one oxetane ring and an oxetane compound having two oxetane rings.

4. The UV-curable ink composition of claim 1, wherein a content of the epoxy compound is 5 to 60 wt % with respect to the total weight of the UV-curable ink composition.

5. The UV-curable ink composition of claim 1, wherein a content of the oxetane compound is 15 to 80 wt % with respect to the total weight of the UV-curable ink composition.

6. The UV-curable ink composition of claim 1, wherein the photopolymerization initiator is an iodonium salt or a sulfonium salt.

7. The UV-curable ink composition of claim 1, wherein a content of the photopolymerization initiator is 1 to 15 wt % with respect to the total weight of the UV-curable ink composition.

8. The UV-curable ink composition of claim 1, wherein a content of the colorant is 1 to 15 wt % with respect to the total weight of the UV-curable ink composition.

9. The UV-curable ink composition of claim 2, wherein a content of the diluent is 0 to 30 wt % with respect to the total weight of the UV-curable ink composition.

10. The UV-curable ink composition of claim 2, wherein the surfactant is a fluorine-based surfactant.

11. The UV-curable ink composition of claim 2, wherein the surfactant is contained in an amount of 0.1 to 5.0 wt % with respect to the total weight of the UV-curable in composition.

12. The UV-curable ink composition of claim 2, wherein the photosensitizer is contained in an amount of 1 to 200 parts by weight with respect to 100 parts by weight of the photopolymerization initiator.

13. The UV-curable ink composition of claim 1, wherein a dose for curing the UV-curable ink composition is 1 to 10,000 mJ/cm$^2$.

14. The UV-curable ink composition of claim 1, wherein the UV-curable ink composition has a viscosity of 1 cP to 50 cP at 25° C.

15. The UV-curable ink composition of claim 14, wherein the UV-curable ink composition has a viscosity of 3 cP to 45 cP at 25° C.

16. The UV-curable ink composition of claim 1, wherein the UV-curable ink composition has a taper angle of 0° to 30° after being cured.

17. The UV-curable ink composition of claim 16, wherein the taper angle is 0° to 10°.

18. The UV-curable ink composition of claim 1, wherein the UV-curable ink composition is for forming a bezel pattern.

19. A method for producing a bezel pattern for a display substrate, comprising:
   a) forming a bezel pattern on a substrate by using the UV-curable ink composition of claim 1; and
   b) curing the bezel pattern.

20. The method of claim 19, further comprising cleaning and drying the substrate prior to a) the forming of the bezel pattern.

21. The method of claim 20, wherein the cleaning and drying of the substrate is carried out by one or more treatments selected from the group consisting of a wet surface treatment, a UV ozone treatment, and a normal pressure plasma treatment.

22. The method of claim 19, wherein the method of forming the bezel pattern on the substrate in Step a) is a method selected from an inkjet printing, a gravure coating, and a reverse offset coating.

23. The method of claim 19, wherein Step a) is carried out at a process temperature of 10° C. to 100° C.

24. The method of claim 23, wherein Step a) is carried out at a process temperature of 20° C. to 70° C.

25. The method of claim 19, wherein the bezel pattern has a thickness of 0.1 μm to 20 μm.

26. The method of claim 25, wherein the bezel pattern has a thickness of 0.5 μm to 5 μm.

27. The method of claim 19, wherein the bezel pattern has a taper angle of 0° to 30°.

28. The method of claim 27, wherein the bezel pattern has a taper angle of 0° to 10°.

29. The method of claim 19, wherein the bezel pattern has an OD value of 0.05 to 2.5 per a film thickness of 1.0 μm.

30. A bezel pattern for a display substrate, which is formed on a substrate by curing the UV-curable ink composition of claim 1.

31. The bezel pattern of claim 30, wherein the bezel pattern has a thickness of 0.1 μm to 20 μm.

32. The bezel pattern of claim 31, wherein the bezel pattern has a thickness of 0.5 μm to 5 μm.

33. The bezel pattern of claim 30, wherein the bezel pattern has a taper angle of 0° to 30°.

34. The bezel pattern of claim 33, wherein the bezel pattern has a taper angle of 0° to 10°.

35. The bezel pattern of claim 30, wherein the bezel pattern has an OD value of 0.05 to 2.5 per a film thickness of 1.0 μm.

* * * * *